(12) United States Patent
Konietzka et al.

(10) Patent No.: US 12,662,730 B2
(45) Date of Patent: Jun. 23, 2026

(54) CoZrTa(X) SPUTTERING TARGET WITH IMPROVED MAGNETIC PROPERTIES

(71) Applicant: Materion Advanced Materials Germany GmbH, Alzenau (DE)

(72) Inventors: Uwe Konietzka, Geiselbach (DE); Martin Schlott, Offenbach (DE)

(73) Assignee: Materion Advanced Materials Germany GmbH, Alzenau (DE)

( * ) Notice: Subject to any disclaimer, the term of this patent is extended or adjusted under 35 U.S.C. 154(b) by 0 days.

(21) Appl. No.: 18/256,261

(22) PCT Filed: Dec. 2, 2021

(86) PCT No.: PCT/EP2021/083887
§ 371 (c)(1),
(2) Date: Jun. 7, 2023

(87) PCT Pub. No.: WO2022/122525
PCT Pub. Date: Jun. 16, 2022

(65) Prior Publication Data
US 2024/0018645 A1 Jan. 18, 2024

(30) Foreign Application Priority Data
Dec. 8, 2020 (EP) ..................................... 20212374
Apr. 20, 2021 (EP) ..................................... 21169384

(51) Int. Cl.
*C23C 14/34* (2006.01)
*C22C 19/07* (2006.01)

(52) U.S. Cl.
CPC .......... *C23C 14/3414* (2013.01); *C22C 19/07* (2013.01)

(58) Field of Classification Search
CPC ........................ C23C 14/3414; C23C 14/3407
See application file for complete search history.

(56) References Cited

U.S. PATENT DOCUMENTS

| | | | |
|---|---|---|---|
| 6,033,536 A | | 3/2000 | Ichihara et al. |
| 6,514,358 B1 * | | 2/2003 | Bartholomeusz ..... H01F 41/183 |
| | | | 148/120 |

(Continued)

FOREIGN PATENT DOCUMENTS

| | | | | |
|---|---|---|---|---|
| CN | 111424245 A | * | 7/2020 | .............. C22C 1/02 |
| EP | 0535314 A1 | | 4/1993 | |

(Continued)

OTHER PUBLICATIONS

Translation to Hasegawa (JP 2011-208265 cited on IDS) published Oct. 2011.*

(Continued)

*Primary Examiner* — John J Brayton
(74) *Attorney, Agent, or Firm* — COZEN O'CONNOR

(57) ABSTRACT

The present invention relates to a sputtering target consisting of an alloy consisting of Co, Zr, Ta and, optionally, one or more further element(s) X from the group of Mo, Pd, Ni, Ti, V, W, and B, characterized in that the target has a maximum magnetic permeability $\mu_{max}$ of 60 or lower and/or characterized in that the target has a maximum pass through flux (PTF) variation ($F_{Max}-F_{Min})/F_{Average}$ of 0.2 or lower, preferably of 0.15 or lower, and most preferably of 0.10 or lower.

14 Claims, 2 Drawing Sheets

(56)        References Cited

U.S. PATENT DOCUMENTS

Figure 1:
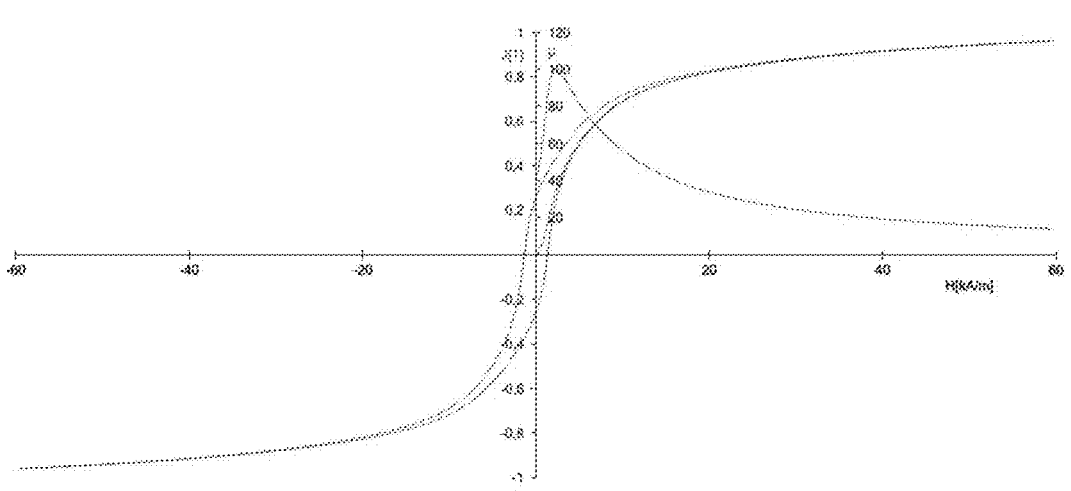

2005/0183797 A1 *   8/2005  Ray ........................ C22C 19/03
                                                                148/556
2010/0300876 A1    12/2010  Hou et al.

FOREIGN PATENT DOCUMENTS

JP            07118818  A   *   5/1995   ............. C22C 19/07
JP         2005320627  A       11/2005
JP         2010189751  A        9/2010
JP         2010280964  A       12/2010
JP         2011208265  A       10/2011
JP         2011214039  A       10/2011

OTHER PUBLICATIONS

Translation to Nishi (JP 07-118818) published 1995.*
International Application No. PCT/EP2021/083887, International
Search Report mailed Mar. 18, 2022, 3 pages.

* cited by examiner

CoZrTa(X) SPUTTERING TARGET WITH IMPROVED MAGNETIC PROPERTIES

This application is a national stage of PCT/EP2021/083887, filed on Dec. 2, 2021, which claims priority to EP Application Serial No. 20212374.1, filed on Dec. 8, 2020 and EP Application Serial No. 21169384.1, filed on Apr. 20, 2021, the entirety of which are incorporated herein by reference.

The present invention relates to a target for sputtering with a magnetron cathode, the target being based on a Co alloy with additives including Zr, Ta and, optionally, at least one of the elements Pt, Pd, Ni, Ti, V, W, and B.

In the process of magnetron cathode sputtering, permanent magnets are installed behind the target (the cathode) to optimize the sputtering process. These magnets are arranged in such a way that a magnetic field forms in front of the target, i.e., in the discharge space. This magnetic field has the effect of localizing the discharge plasma. The area of the target surface over which the plasma is localized is subjected to more active sputtering, as a result of which an erosion groove (or race track) is formed there.

In the case of ferromagnetic targets, such as CoZrTa(X) alloys, there are two main problems which occur in this situation:

First, the magnetic flux of the permanent magnets is focused within the target, so that only a small amount of flux can penetrate into the discharge space. This problem therefore requires the use of very thin ferromagnetic targets—or extremely strong magnet sets.

Second, the local reduction in the cross section of the target (erosion groove) which occurs when cathodic sputtering is carried out with ferromagnetic targets has the effect of increasing the magnetic flux directly above the erosion groove. As a result, there is a local increase in ionization of the sputtering gas and also a local increase in the sputtering rate. The erosion groove therefore becomes increasingly narrow, as the sputtering progresses, and this is associated with a very low rate of target material utilization.

Furthermore, the variation of the magnetic pass through flux measured at different points of the targets should be as low as possible, so that target material utilization is as homogenous and the thickness of the deposited film is as uniform as possible.

Improved magnetic field geometries and higher magnetic field penetration can be achieved by means of complicated target designs. The magnetic resistance in the target can be increased and a larger field produced in the discharge space by providing the target with slots perpendicular to the direction of the magnetic field (K. Nakamura et al.: IEEE Transactions on Magnetics, Vol. MAG-18, pp. 1,080-1,082, 1982).

Kukla et al. (IEEE Transactions on Magnetics, Vol. MAG-23, pp. 137-139, 1987) describe a cathode for ferromagnetic materials, which consists of several individual targets, arranged in two planes one above the other, in order to obtain a stronger magnetic field. These designs are more expensive, however, and make the operation of magnetron cathode sputtering more difficult.

EP 535 314 A1 relates to a sputtering target of platinum-cobalt alloy consisting essentially of 10 to 55% by weight of platinum; 1 to 15% by weight of a first additional element selected from the group consisting of nickel and tantalum; no more than 1.5% by weight of a second additional element selected from the group consisting of boron, titanium, lanthanum, cerium, neodymium, beryllium, calcium, zirconium and silicon; no more than 20% by weight of chromium; and balance cobalt. The target has a magnetic permeability of no larger than 30.

It is the object of the present invention to provide a target material based on an CoZrTa(X) alloy which has improved magnetic properties when used for magnetron cathode sputtering, i.e. which allows for an enhanced magnetic field penetration through the target material when used in conjunction with magnetron cathodes and/or which has improved magnetic homogeneity, i.e. which shows a reduced variation of the magnetic pass through flux at different points of the target.

The present invention is based on the finding that such a sputtering target can be provided if the CoZrTa(X) alloy is thermally treated at high temperature so that the magnetic permeability of the alloy is reduced and also the variation of the magnetic flux is reduced.

Accordingly, the present invention relates to a sputtering target consisting of an alloy consisting of Co, Zr, Ta and optionally one or more further element X from the group of Mo, Pd, Ni, Ti, V, W, and B, wherein the target has a maximum magnetic permeability $\mu_{max}$ of 60 or lower and/or wherein the target has a maximum pass through flux (PTF) variation $(F_{Max}-F_{Min})/F_{Average}$ of 0.2 or lower, preferably of 0.15 or lower, and most preferably of 0.10 or lower, wherein $F_{Max}$ is the maximum magnetic flux density measured at a measuring point on the target, $F_{Min}$ is the minimum magnetic flux density measured at a measuring point on the target, $F_{Average}$ is the average magnetic flux density, i.e. the sum of the measured magnetic flux densities at all measuring points divided by the number of measuring points, and wherein the measurement is carried out at 7 equally spaced different measurement points of a target as described herein below.

The sputtering target of the invention has a reduced magnetic permeability and hence allows for an increased magnetic flux through the target, and also shows a low variation of the magnetic flux at different points of the target so that the above described main problems in magnetron sputtering can be avoided or at least alleviated and the objects of the invention can be achieved.

Targets of the invention can be manufactured to an increased thickness which provides a longer target lifetime at the user, better film uniformity and a more constant sputtering rate over target life.

Preferably, the total amount in at. % of element(s) X is smaller than the larger one of the two additions of Ta or Zr in at. %, Zr is preferably present in the alloy in an amount of from 2 to 8 at. %, more preferably from 3 to 7 at. %.

Ta is preferably present in the alloy in an amount of from 2 to 8 at. %, more preferably from 3 to 7 at. %.

If in the alloy one or more further optional element X from the group of Mo, Pd, Ni, Ti, V, W, and B is present, this is preferably in a total amount of element(s) X of up to 7 at. %, more preferably of up to 3 at. %.

Preferably, if a further element X from the group of Mo, Pd, Ni, Ti, V, W, and B is present in the alloy it is only one of these elements.

Preferably, in the sputtering target of the invention Co is present in the CoZrTa(X) alloy in an amount of at least 75 at. %, more preferably at least at. %.

The CoZrTa(X) alloy consists of Zr, Ta, optionally one or more further element X from the group of Mo, Pd, Ni, Ti, V, W, and B, and Co, i.e. Co makes up the remainder of the atoms in the alloy.

The sputtering target of the invention preferably has a maximum magnetic permeability $\mu_{max}$ of 50, more preferably of 40 or lower.

The maximum magnetic permeability $\mu_{max}$ is usually not less than 10 or 20.

Further preferred, the sputtering target of the invention has a saturation magnetization Js, measured as Js=J(H=60 kA/m) of 0.8 T or below.

The saturation magnetization Js is usually not less than 0.5 T.

Preferably, the magnetic pass through flux (PTF) of the target measured according to ASTM F2086-01 in the center of a 8 mm thick test piece is 20% or higher, more preferably is 25% or higher.

The invention further relates to a process for producing a sputtering target material consisting of an alloy consisting of Co, Zr, Ta and, optionally, one further element X from the group of Mo, Pd, Ni, Ti, V, W, and B, wherein the process involves heating the alloy to a temperature of at least 700° C., more preferably to at least 750° C. and still more preferably at least 800° C.

Preferably, heating is performed to a temperature of at most 1000° C., more preferably at most 900° C.

Usually, heating is done by introducing the alloy into an oven pre-heated to the desired temperature.

Heating of the alloy to the temperature as prescribed above is preferably performed for a time of 10 to 60 hours, more preferably 12-48 hours.

Furthermore, the invention relates to a magnetron sputtering process in which a sputtering target in any one of the embodiments described herein is used, and to the use of a sputtering target in any one of the embodiments described herein for magnetron sputtering.

The present invention will further be illustrated on the basis of the following examples with reference to the figures, which show:

FIG. 1: Magnetic hysteresis curve of a CoZrTa alloy not in accordance with the invention, FIG. 2: Magnetic hysteresis curve of a CoZrTa alloy in accordance with the invention.

DEFINITIONS/MEASUREMENT METHODS a) Measurement of the Magnetic Properties

Pass Through Flux (PTF) was measured according to ASTM F2086-01 method 2 in the center of 8 mm thick test pieces of 653×133 mm size.

In order to determine the variation of the pass through flux on the targets of the invention, PTF was measured according to ASTM F2086-01 method 2 by placing a 4 mm thick finish machined target plates of 650×130 mm, 4 mm+−0.1 thickness on the PTF measurement stand. The measurements were performed at 7 different equally spaced positions along the length of the targets. Accordingly, all measurement point were at the middle position (65 mm) along the breadth (130 mm) of the target, and were at the following positions along the length (650 mm) of the target, seen from the left end (0 mm):

Point 1: 50 mm
Point 2: 142 mm
Point 3: 234 mm
Point 4: 325 mm
Point 5: 415 mm
Point 6: 508 mm
Point 7: 600 mm.

Magnetization curves were measured to compare the as rolled and the heat treated material using Remagraph C of Magnet-Physik in accordance with DIN EN 60404-4.

EXAMPLES

Example 1

A CoZrTa alloy with 91.5 at. % Co, 4 at. % Zr and 4.5 at % Ta was produced by conventional vacuum induction melting and casting, followed by hot rolling at 1200° C. to obtain a plate with dimensions 653×133×8 mm.

The plate was then subjected to a heat treatment at 860° C. for 26 h followed by air cooling, which resulted in a significant increase of the magnetic pass through flux (PTF): PTF before the heat treatment was 10.7%, whereas PTF after heat treatment was 30.2%.

As can be seen from FIG. 1, untreated material shows a maximum permeability of ~100 at magnetic fields of ~3 kA/m together with a saturation magnetization of 960 mT. As a consequence, only up to 4 mm thick target can be ignited on standard cathodes.

Figure 2:
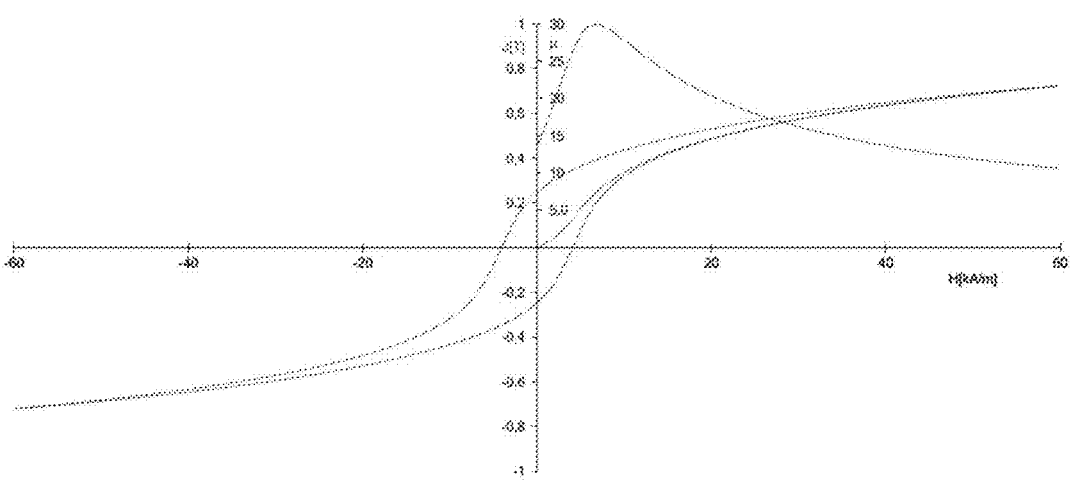

In contrast, as can be seen from FIG. 2, the heat treated alloy according to the invention shows a 3× lower maximum permeability of ~30 at considerably higher magnetic fields of 15 kA/m together with a lowered saturation magnetization of 721 mT. Igniting a 6 mm target on the same cathode was no problem.

Example 2

Four CoZrTa alloy samples with a composition of 91.5 at. % Co, 4 at. % Zr and 4.5 at % Ta each were produced by conventional vacuum induction melting and casting, followed by hot rolling at 1200° C. to obtain four plates with dimensions 653×133×8 mm.

The plates were then subjected to a heat treatment at 860° C. for 26 h followed by air cooling.

The PTF of the plates after heat treatment was 30.2%.

Measurement of the magnetization curve of the plates yielded a maximum permeability of ~30 at magnetic fields of 15 kA/m and a saturation magnetization of 721 mT.

Targets A, B C and D with dimensions of 650×130×4 mm were machined from the four CoZrTa alloy plates.

The results of the PTF measurements at the various positions of the targets are given in Table 1:

TABLE 1

| Measurement point | Target A Flux Density/ Gauss | PTF % | Target B Flux Density/ Gauss | PTF % | Target C Flux Density/ Gauss | PTF % | Target D Flux Density/ Gauss | PTF % |
|---|---|---|---|---|---|---|---|---|
| 1 | 193.8 | 46.14% | 199.5 | 47.50% | 198.9 | 47.36% | 199.3 | 47.45% |
| 2 | 188.1 | 44.79% | 191.6 | 45.62% | 191.3 | 45.55% | 187.5 | 44.64% |
| 3 | 191.3 | 45.55% | 191.4 | 45.57% | 193.5 | 46.07% | 187.2 | 44.57% |
| 4 | 186.5 | 44.40% | 192.3 | 45.79% | 194.2 | 46.24% | 190.0 | 45.24% |

TABLE 1-continued

| Measurement point | Target A Flux Density/ Gauss | PTF % | Target B Flux Density/ Gauss | PTF % | Target C Flux Density/ Gauss | PTF % | Target D Flux Density/ Gauss | PTF % |
|---|---|---|---|---|---|---|---|---|
| 5 | 183.0 | 43.57% | 185.0 | 44.05% | 188.6 | 44.90% | 187.1 | 44.55% |
| 6 | 184.3 | 43.88% | 186.0 | 44.29% | 190.0 | 45.24% | 188.0 | 44.76% |
| 7 | 195.0 | 46.43% | 196.9 | 46.88% | 199.6 | 47.52% | 197.0 | 46.90% |
| Average Flux Density | 188.8 | 44.97% | 191.8 | 45.67% | 193.7 | 46.13% | 190.9 | 45.45% |
| $F_{Max} - F_{Min}$ | 12 | 2.86% | 14.5 | 3.45% | | 2.62% | | 2.90% |
| $(F_{Max} - F_{Min})/F_{Average}$ | 0.064 | | 0.076 | | 0.057 | | 0.064 | |

As can be seen from Table 1 the tested targets showed a low variation of the PTF throughout the targets, as expressed by the low values for $(F_{Max}-F_{Min})/F_{Average}$.

The invention claimed is:

1. Process for producing a sputtering target consisting of a cast alloy consisting of Co, Zr, Ta and, optionally, one or more further element(s) X from the group of Mo, Pd, Ni, Ti, V, W, and B, characterized in that the process involves a heat treatment of the cast alloy to a temperature in the range of 700 to 1000° C., for a time of 10 to 60 hours, and wherein the sputtering target has a maximum pass through flux (PTF) variation $(F_{Max}-F_{Min})/F_{Average}$ of 0.2 or lower and a maximum magnetic permeability $\mu_{max}$ of 60 or lower.

2. Process according to claim 1 wherein the process involves a heat treatment of the cast alloy to a temperature in the range of 800 to 900° C., for a time of 12 to 48 hours.

3. The process according to claim 1, wherein the target has a maximum pass through flux (PTF) variation $(F_{Max}-F_{Min})/F_{Average}$ Of 0.15 or lower.

4. The process according to claim 1, wherein the target has a maximum pass through flux (PTF) variation $(F_{Max}-F_{Min})/F_{Average}$ of 0.10 or lower.

5. The process according to claim 1, wherein the target has a maximum magnetic permeability $\mu_{max}$ of 50 or lower.

6. The process according to claim 1, wherein the target has a maximum magnetic permeability $\mu_{max}$ of 40 or lower.

7. The process of claim 1, wherein Co is present in an amount of at least 75 at. %.

8. The process of claim 1, wherein Zr is present in an amount ranging from 2 at. % to 8 at. %.

9. The process of claim 8, wherein Zr is present in an amount ranging from 3 at. % to 7 at. %.

10. The process of claim 1, wherein Ta is present in an amount ranging from 2 at. % to 8 at. %.

11. The process of claim 10, wherein Ta is present in an amount ranging from 3 at. % to 7 at. %.

12. The process of claim 1, wherein the one or more further elements X is present in a total amount of element(s) X of up to 7 at. %.

13. The process of claim 1, wherein the one or more further elements X is present in a total amount of element(s) X of up to 3 at. %.

14. The process of claim 1, wherein only one of further element(s) X from the group of Mo, Pd, Ni, Ti, V, W, and B is present.

* * * * *